United States Patent
Auzelyte et al.

(10) Patent No.: US 10,146,128 B2
(45) Date of Patent: Dec. 4, 2018

(54) TOOL SURFACE NANO-STRUCTURE PATTERNING PROCESS

(71) Applicant: MORPHOTONIX SARL, Ecublens (CH)

(72) Inventors: Vaida Auzelyte, Orbe (CH); Veronica Savu, Renens (CH)

(73) Assignee: MORPHOTONIX SARL, Ecublens (CH)

( * ) Notice: Subject to any disclaimer, the term of this patent is extended or adjusted under 35 U.S.C. 154(b) by 0 days.

(21) Appl. No.: 15/573,704

(22) PCT Filed: May 3, 2016

(86) PCT No.: PCT/IB2016/052499
§ 371 (c)(1),
(2) Date: Nov. 13, 2017

(87) PCT Pub. No.: WO2016/181253
PCT Pub. Date: Nov. 17, 2016

(65) Prior Publication Data
US 2018/0120696 A1 May 3, 2018

(30) Foreign Application Priority Data
May 14, 2015 (EP) .................................. 15167753

(51) Int. Cl.
*B44C 1/22* (2006.01)
*G03F 7/00* (2006.01)
*G03H 1/02* (2006.01)

(52) U.S. Cl.
CPC ............. *G03F 7/0002* (2013.01); *G03H 1/02* (2013.01); *G03H 1/0244* (2013.01);
(Continued)

(58) Field of Classification Search
None
See application file for complete search history.

(56) References Cited

U.S. PATENT DOCUMENTS 4,512,848 A 4/1985 Deckman
8,029,964 B1 10/2011 Almanza-Workman
(Continued)

FOREIGN PATENT DOCUMENTS

JP S57178810 11/1982

OTHER PUBLICATIONS

International Search Report and Written Opinion of the International Searching Authority, dated Sep. 14, 2016, for International patent application No. PCT/IB2016/052499; 12 pages.

*Primary Examiner* — Shamim Ahmed
(74) *Attorney, Agent, or Firm* — Faegre Baker Daniels LLP

(57) ABSTRACT

Method of patterning a surface of an object or a tool with nano and/or micro structure elements having dimensions in a range of 1 nanometer to 1 millimeter, comprising the steps of producing a flexible mask with said nano or micro structure pattern formed on a surface of said flexible mask, chemically activating said surface of the flexible mask and/or said surface to be patterned of the tool, placing said patterned surface of the flexible mask in contact with said surface to be patterned of the object or tool, promoting a covalent bonding reaction between said patterned surface of the flexible mask in contact with said surface to be patterned, removing the flexible mask from the tool whereby a layer of said flexible mask remains bonded to said surface to be patterned of the tool, etching said surface to be patterned of the tool whereby the bonded layer of flexible mask material resists etching. An anti-activation mask defining a periphery of the surface area to be patterned, or peripheries of the surface area to be patterned if there are a plurality of separate portions of surface area to be patterned, is deposited on the flexible mask prior to placing the patterned surface of the flexible mask on the surface to be patterned. The anti-activation mask prevents bonding of the flexible mask to the (Continued)

surface of the object or tool in areas where the anti-activation mask is present.

16 Claims, 3 Drawing Sheets

(52) U.S. Cl.
CPC ... *G03H 1/0276* (2013.01); *G03H 2001/0292* (2013.01); *G03H 2260/63* (2013.01); *G03H 2270/31* (2013.01)

(56) References Cited

U.S. PATENT DOCUMENTS

| | | |
|---|---|---|
| 2005/0244535 A1 | 11/2005 | Tokura |
| 2008/0055581 A1* | 3/2008 | Rogers .................. B82Y 10/00 |
| | | 355/95 |
| 2008/0248405 A1 | 10/2008 | Almanza-Workman |
| 2009/0130607 A1* | 5/2009 | Slafer .................... B82Y 10/00 |
| | | 430/323 |
| 2012/0149211 A1 | 6/2012 | Ojima |
| 2013/0006135 A1* | 1/2013 | Boillon ............... A61B 5/0478 |
| | | 600/544 |

* cited by examiner

FIG 1A  Master Pattern

FIG 1B  Master Pattern with Flexible mask formed thereon

Flexible mask

Flexible mask with area mask, the surface is chemically activated

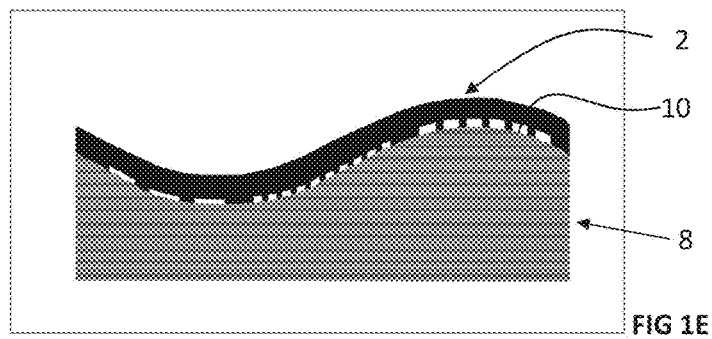
FIG 1E — Flexible mask is placed in contact with chemically activated tool surface and bonded
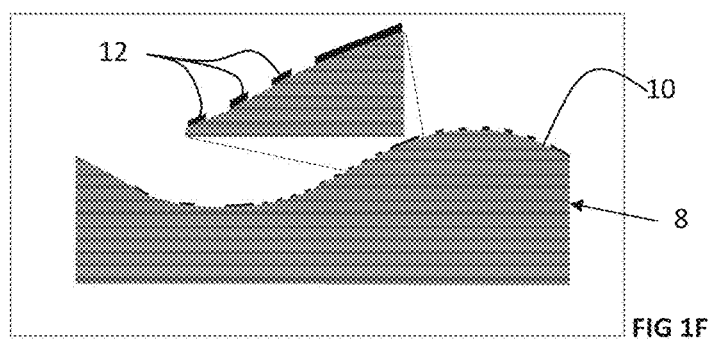
FIG 1F — Flexible mask is removed from tool surface; thin layer of mask material stays on the tool
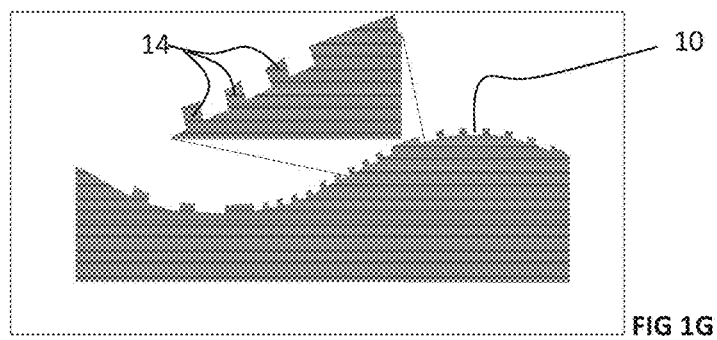
FIG 1G — Pattern transfer to tool by etching

TOOL SURFACE NANO-STRUCTURE PATTERNING PROCESS

This application claims priority to PCT application number PCT/IB2016/052499 filed May 3, 2016, which in turn claims priority from EP Patent application number EP 15167753.1 filed May 14, 2015, the subject matter of which are incorporated herein by reference.

The present invention relates to a process of patterning a surface of a tool with nano or micro sized structures. The invention in particular relates to a process for patterning a molding, embossing or imprinting tool surface. The invention in particular relates to a process for patterning a non-flat or free-form tool surface.

The patterning of a molding die tool surface with nano or micro sized structures may be used to produce various visual or functional effects on object surfaces molded with the patterned molding die for various esthetic or functional purposes. Nano to micro sized structures may have dimensions in the range 1 nm to 1 mm ($10^{-6}$ to $10^{-3}$ meters), more typically in the range of 5 nm to 2000 nm. Visual effects include holographic, light diffusion and microlense types of effects. Functional purposes may include fluidic systems, covert security features, enhancing surface catalytic effects, bonding properties, or chemical surface reactions.

Patterning of micro and nano sized structures on flat surfaces is well known and widely used for instance in the semi-conductor industry, for instance in the manufacture of integrated circuits by various material deposition and lithography processes. Such processes are either difficult or very costly to implement for the production of many articles with non-flat surfaces, for instance on curved surfaces of injection molded or compression die molded parts.

Various processes for nano and micro patterning of curved surfaces are disclosed in WO01/74560, WO2011/038741 and WO2013/154582. One of the processes disclosed involves the steps of producing a flat master patterned tool, casting a flexible slave tool from the master and transferring the slave to the non-flat molding die surface, followed by hardening such that the molding die is provided with a patterned surface corresponding to the negative of the master patterning tool. Another technique disclosed in this prior art is the use of the flexible patterning tool to imprint a nano/micro patterned structure on the surface of the molding die which is coated with a hardenable material. An important drawback of such processes is that the deposited material bonded on the molding die surface to form the patterning does not have a high mechanical, chemical or thermal resistance, leading to limited uses, short life cycles, and high maintenance and replacement costs. Such processes also have limitations in the dimensional accuracy of the patterns formed, in particular at the edges of the imprinted pattern in view of the overflow of the masking materials during the imprinting process. There are also inherent limitations in these processes in the height of patterned elements and the time and cost involved in curing the deposited micro patterned material.

Standard lithography processes on non-flat surfaces are very difficult to implement accurately and cost effectively in view of the difficulty of focusing the pattern of light on the non-flat surface to photoactivate the mask with the required pattern. In US2005/0244553 it is proposed to position the photomask directly on the die surface, however this is costly to implement and very limited in the shapes the forms that the die may adopt. Another drawback of producing a mask directly onto the molding die surface and subsequent etching of the molding die surface according to conventional processes, stems from the difficulty of producing very small and dimensionally accurate nano/micro structures with well defined peripheries/edges, inter alia due to the thickness of the mask layer and the complexity in removal of residual material or photo resist material from the die surface during or prior to etching.

Lithography processes on non-flat die surfaces in which a photoresist mask is first prepared flat and then transferred to a curved die surface is described in JP57178810. In JP57178810 an ink resist layer pattern is printed on a flat flexible substrate and the ink then transferred to a curved die which is then etched. This conventional process also suffers from the difficulty of producing very small and dimensionally accurate nano/micro structures and patterns with well defined peripheries and edges, the accuracy of the etching process being affected by the thickness of the transferred ink layer and the quality of the bonding of the resist layer to the die surface.

In view of the foregoing, it is a general object of this invention to provide a method of patterning a non-flat surface of a tool or object that is cost effective and produces a tool or object with dimensionally accurate nano or micro sized surface elements as well as the overall pattern.

For certain applications, it is a specific object of the invention to provide a method of patterning a non-flat surface of a molding, embossing, pressing or imprinting tool, that is cost effective and produces a tool with dimensionally accurate nano or micro sized surface elements.

It is advantageous to provide a method of patterning a tool surface with nano and micro structure elements that allows to produce a durable tool, in particular with high chemical, mechanical and/or thermal resistance depending on the desired application.

It is advantageous to provide a method of patterning a tool with nano/micro structures that allows a great degree of freedom in the generation of various patterns on free form tools with various shapes, including complex shapes.

It is advantageous to provide a method of patterning a non-flat tool surface that is easy to implement in a wide variety of applications and that allows to produce a tool in a quick and cost effective manner.

Objects of the invention have been achieved by providing a tool according to claim 1.

Disclosed herein is a method of patterning a surface of an object or a tool with nano and/or micro structure elements having dimensions in a range of 1 nanometer to 1 millimeter. The method comprises the steps of:
  producing a flexible mask with said nano or micro structure pattern formed on a surface of said flexible mask,
  chemically activating said surface of the flexible mask and/or said surface to be patterned of the tool, the chemical activation modifying chemical properties at the surface of the flexible mask or surface to be patterned of the object or tool to enhance bonding of the chemically activated surface to a complementary material placed in contact with the chemically activated surface,
  placing said patterned surface of the flexible mask in contact with said surface to be patterned of the object or tool,
  promoting a covalent bonding reaction between said patterned surface of the flexible mask in contact with said surface to be patterned,
  removing the flexible mask from the tool whereby a layer of said flexible mask remains bonded to said surface to be patterned of the tool.

According to an aspect of the invention, an anti-activation mask defining the periphery of the surface to be patterned (and as a consequence also the surface not to be patterned) is deposited on the flexible mask and/or on the object or tool prior to said covalent bonding reaction, said anti-activation mask preventing bonding of the flexible mask to the object or tool surface in the areas covered by the anti-activation mask.

In an embodiment the anti-activation mask is placed on the patterned surface of the flexible mask and/or object or tool prior to chemical activation. In this embodiment, the anti-activation mask may be removed from the flexible mask and/or object or tool after the chemical activation step.

In an embodiment the anti-activation mask is placed on the patterned surface of the flexible mask and/or object or tool after chemical activation. In this embodiment, the anti-activation mask remains on the flexible mask and/or object or tool after the chemical activation step and during the step of placing said patterned surface of the flexible mask in contact with said surface to be patterned of the object or tool.

In an embodiment the anti-activation mask comprises a radiation sensitive layer patterned using lithographic methods, such as resist mask patterned using UV lithography. The radiation sensitive layer may be coated on the flexible mask, subsequently exposed with UV light via a mask that has areas of defined size and shape, and the exposed areas affected by radiation are developed leaving anti-activation mask on the surface.

In an embodiment the anti-activation mask comprises a carrier film that has ink printed shapes, whereby the carrier film is put into contact with the surface of flexible mask, optionally heated, and separated from the flexible mask, the ink printed shapes defining anti-activation mask size remaining on the flexible mask.

In an embodiment, the method further includes etching said surface to be patterned of the object or tool whereby the bonded layer of flexible mask material resists etching.

In an advantageous embodiment, both the patterned surface of the flexible mask and the surface to be patterned of the object or tool are chemically activated.

In an advantageous embodiment, the chemical activation of the flexible mask and/or the object or tool surface is dry or wet chemical activation. The chemical activation may be selected from plasma charged activation, light or laser beam activation, electrical field activation, magnetic field activation, reactive gas activation, or liquid chemical solution activation.

Dry chemical activation may for instance comprise surface activation by plasma, ozone or UV light treatment.

In an embodiment, wet chemical activation comprises immersion of the surface to be activated in a liquid solution for chemical activation, subsequently rinsing the surface with water, and drying the surface by gas flow.

In an advantageous embodiment, the liquid solution for chemical activation is selected for instance from a phosphoric acid solution for aluminium surface activation and a HF solution for glass surface activation.

In an advantageous embodiment, the flexible mask is produced by forming of a hardenable material on a flat master pattern tool.

In an advantageous embodiment, the flexible mask is made from a polymeric material.

In an advantageous embodiment, the flexible mask is made from silicone, in particular PDMS.

In an embodiment, the object or tool is made of metal.

The object or tool may be coated with a material selected from a metal such as titanium, aluminium, chromium, nickel, gold or platinum, or from a non-metal such as sol-gel type of amorphous ceramics, crystalline ceramics, diamond, and multilayers of these materials.

In an embodiment, the method is applied to a tool, said tool selected from a group consisting of a molding tool, an imprinting tool, an embossing tool, a cutting tool, a pressing or stamping tool.

The invention also relates to an article manufactured by using a tool patterned with nano and/or micro structure elements according to this invention. In embodiments, the article may be made of plastic, glass, metal or ceramic.

Further objects and advantageous features of the invention will be apparent from the claims, from the detailed description, and annexed drawings, in which:

FIGS. 1A-1G are schematic illustrations of a process of patterning a non-flat tool surface according to an embodiment of the invention;

Figure 1C:
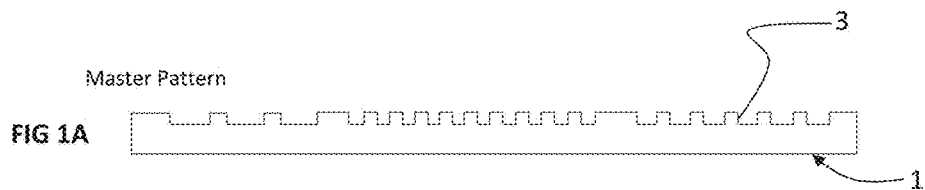
Figure 1C:
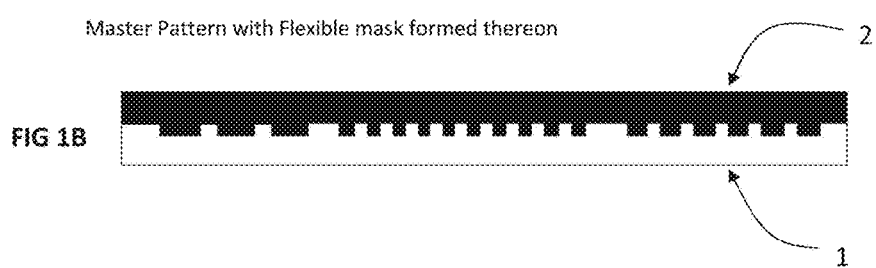
Figure 1C:
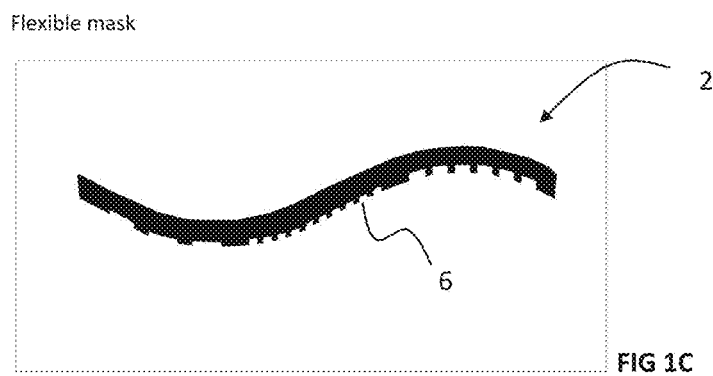

Referring to the figures, an exemplary embodiment of a process of patterning a surface 10 of a tool or object 8 according to an embodiment of the invention is schematically illustrated. The object or tool 8 may be an item of direct use or a tool used for the preparations of other items such as objects of metal, glass, ceramic, plastic or other material surfaces such as metallic containers or parts thereof, decorative parts, optical glass parts and jewelry. Examples of the tools that can advantageously be patterned according to a method of the invention include molding tools, imprinting and embossing tools, cutting or pressing tools used to shape plastics, metal, ceramics, glass and other materials. Examples of molding tools that can advantageously be patterned according to a method of the invention include a compression die molding tool, an injection molding tool, or a blow molding tool.

In some embodiments of the invention the tool surface is preferably smooth with typical average surface roughness from 2 nm to 200 um, preferably in the range of 2 nm to 50 nm.

The surface of the tool may be optionally coated, for instance with a metal such as titanium, aluminum, chromium, nickel, gold or platinum, or for instance with non-metallic coatings such as sol-gel type of amorphous ceramics, crystalline ceramics, diamond, and multilayers of these materials. The coating layer may be deposited using physical, chemical or molecular deposition methods. The thickness of the coating layer may for instance be between 0.03 um and 200 um, preferably 0.5 um to 10 um.

In the illustrated process, starting with FIG. 1a, step S1, a master pattern tool 1 comprising a nano/micro structured master pattern 3 is produced. The master pattern corresponds to a nano/micro structured pattern, at least in part, of the object or tool 8 that is intended to be manufactured using the invention process. The master pattern tool can be made by various known processes in various materials. For instance the nano/micro master pattern may be produced by lithographic or direct patterning methods, or may be a natural surface or the result of specific surface treatments and materials such as etching processes on heterogeneous materials or crystalline materials that lead to non-uniform surface material removal.

Lithography may for instance involve defining the nano/micro pattern into radiation sensitive material layer and its transfer onto a silicon wafer surface by conventional pattern transfer methods, such as wet or dry etching, or lift-off.

Direct patterning methods may include direct or masked writing with beams of particles, visible light or other types of radiation. The writing may be performed in a specific radiation sensitive material that is directly removed, for example, by ablation, or that is removed by post-processing, for example by chemical developing processes.

Natural surfaces may be naturally occurring surfaces with intrinsic roughness. Specific surface treatments may be used to produce functional surfaces (other than lithographic or direct) by specific surface treatments, including by deposition of a layer, for example, self-assembly of particles or molecules, or by dry or wet chemical etching.

The master with nano/micro patterns my for instance be a silicon wafer, or a copy in plastic, elastomer or metal, or another material. Typical sizes for many molding die tool applications may for example be from 1 cm to 25 cm or larger.

The master pattern can have one or several separated areas, forming islands, or a single continuous area of joining regions with nano/micro structures.

The size of nano/micro patterns is typically in the range from 5 nm to 2000 um. Optimal geometries, at least along one dimension, may for instance have the following dimensions:

For holographic effects and holograms: 30 nm to 10 um size and 30 nm to 10 um depth feature
For micro optical elements: 1 to 1000 um diameter and 1 to 1000 um height semi-spherical microlens
For random patterns: 5 nm to 1000 um size and 5 nm to 1000 um depth features According to an interesting feature of an embodiment of the invention, the separation of light impinging on the nano/micro patterned surface into various constituent colors of the light due to diffractive effects may be controlled by configuring the properties of the nano/micro elements of the patterned surface, said properties including the size, shape, period and direction of the nano/micro elements.

Micro/nano patterns may comprise any periodic, arbitrary or random shapes and patterns, shapes from 2D to 3D that are recognized or visible by eye or readable by optical devices (e.g. laser readers, scanners) or non-optical means (e.g. electron or X-ray imaging). Examples of periodic patterns comprise diffractive gratings and phase elements that operate by means of interference and diffraction to produce various optical effects and systems. Applications include holograms and holographic like effects, microlenses, light diffusers, micro or nano-channels, and chemical reactors. Holographic like effects may be generated by nano/micro patterns of lines, dots or other basic shapes arranged periodically, whereby the areas with different periods, size, shape, direction and height create colour change effects in the resulting image. Random patterns comprise nano/micro patterns, of lines, dots or other basic shapes distributed randomly with respect to each other. Applications include black or white colour effects, light diffusers, hydrophobic to hydrophilic surfaces, anti-sticking or anti-reflective surfaces among many other possible applications. Arbitrary shapes comprise any pattern, design, or text that has an area having micro or nano-scale features. Examples include text, images and designs that are or have at least one part that is detectable only with special means, such as with a magnifying glass, optical microscope or electron microscope. Applications include micro and nano sized text, designs, micro and nanochannels and their systems.

Following the preparation of the master pattern tool, in a subsequent step S2 and shown in FIG. 1b, a flexible material in particular a polymeric material, for instance PDMS (Poly-dimethyl-siloxane), is deposited on the surface of the master pattern tool and cured by a thermally activated, light activated or chemically activated process depending on the material from which the flexible mask is made.

A flexible mask with micro/nano pattern is thus obtained from a master. It can be prepared by copying the master using the methods such as chemical vapour deposition, imprinting or casting. In a casting procedure, liquid state material is cast on the master pattern, then solidified and removed from master's surface. The copy is a negative of the master.

In an advantageous embodiment the material for casting the flexible mask is a silicone rubber PDMS (Poly-dimethyl-siloxane). Ten parts of liquid silicone rubber is mixed with one part of cross-linker and dispersed over the surface of master silicon wafer. It is cured at 80° C. for one hour and then detached from the master. In a specific example, the flexible mask is in the form of a membrane of 0.1 mm to 5 mm thickness. Micro/nano structures may cover all or a part of the flexible mask surface.

In another embodiment, a polymer, such as parylene, is deposited on the surface of a master from a gaseous state in a vacuum chamber using chemical vapor deposition. After the deposition the thin layer of parylene, for instance 0.1 mm to 2 mm thick, is peeled off the surface off the master.

Once the flexible mask is as cured or solidified, it may be removed from the master pattern tool, the flexible mask 2 comprising the desired nano and micro structures is schematically illustrated in FIG. 1c.

Figure 1D:
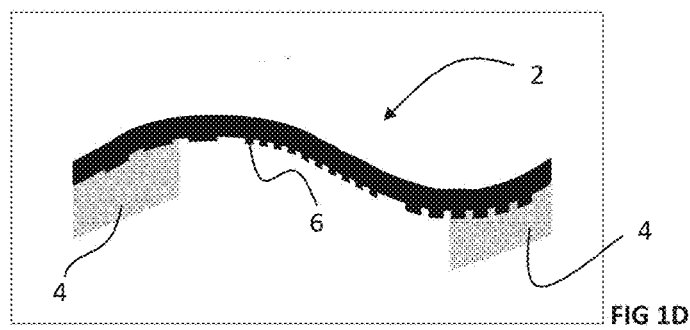
Figure 2:
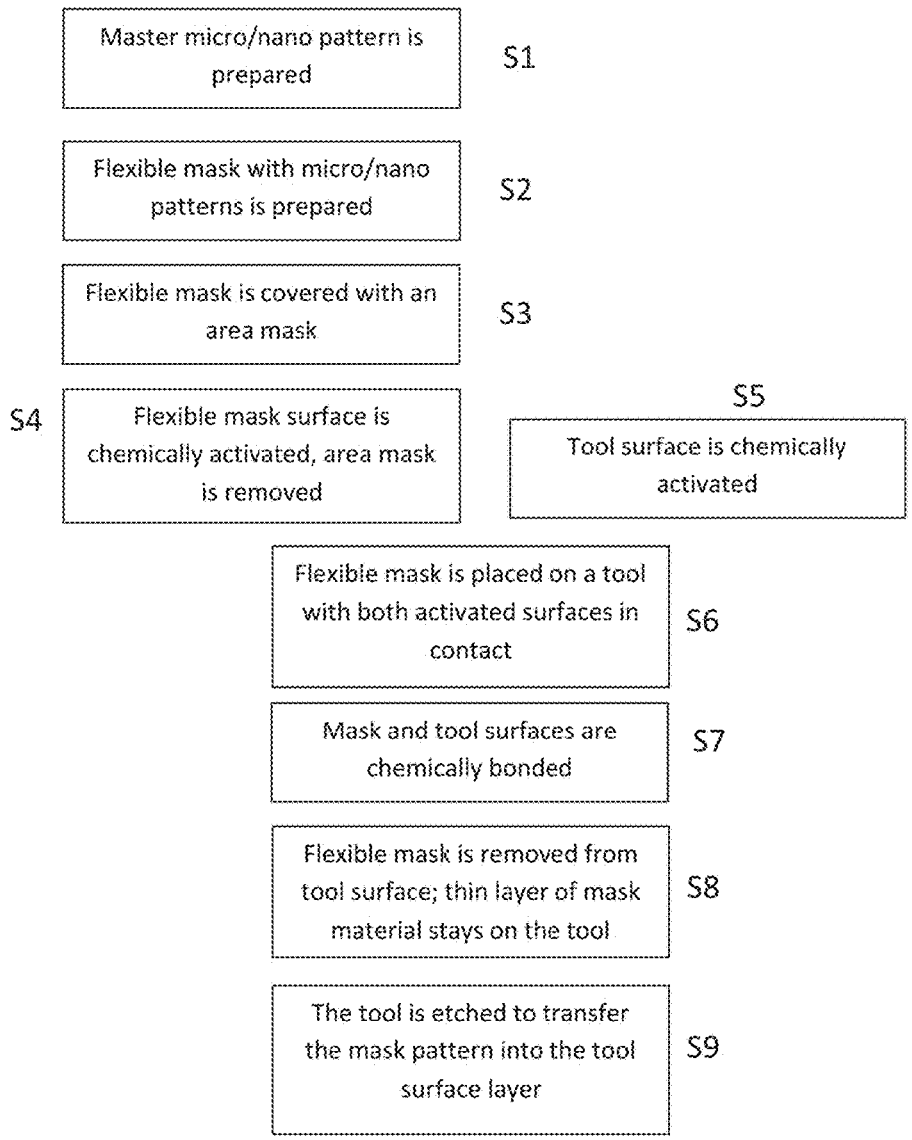
FIG. 2 is a flowchart illustrating main steps of a process of patterning a non-flat tool surface according to an embodiment of the invention.

In a step S3 as illustrated in FIG. 1d, an anti-activation masking material 4 may be deposited on surface areas of the flexible mask that define the periphery or peripheries of the surface to be patterned. There may be more than one fully enclosed patterned surface area, thus forming islands of patterned surface areas.

In a first embodiment, the anti-activation mask is placed on the patterned surface of the flexible mask and/or object or tool prior to chemical activation of the flexible mask patterned surface or surface to be patterned of the object or tool. In the first embodiment, the anti-activation mask may be removed from the flexible mask and/or object or tool after the chemical activation step.

In a second embodiment, the anti-activation mask is placed on the patterned surface of the flexible mask and/or object or tool after chemical activation. In this second embodiment, the anti-activation mask remains on the flexible mask and/or object or tool after the chemical activation step and during the step of placing said patterned surface of the flexible mask in contact with said surface to be patterned of the object or tool.

By chemical activation it is meant that the chemical properties at the surface of the flexible mask or of the object or tool are modified in a manner to enhance bonding of the surface to a complementary material placed in contact with the chemically activated surface. The chemical activation of the patterned surface areas of the flexible mask may be effected by various means as will be described in more detail further on.

In an embodiment, the anti-activation masking material 4 may be a flexible or rigid layer that is pre-defined in desired size and shape, and applied to the selected location of the flexible mask. The anti-activation area mask can for instance comprise a polymer foil with adhesive layer. Examples include scotch-type film and sheets that after the application is adhered firmly to the surface of the flexible mask. The desired size and shape of the area mask may be cut mechanically or using laser cutting.

The anti-activation area mask may also be deposited on the patterned surface 6 of the flexible mask or object or tool surface.

Another example of the anti-activation mask is a radiation sensitive layer patterned using lithographic methods, such as resist mask patterned using UV lithography. The radiation sensitive film is coated on the flexible mask, subsequently exposed with UV light via a mask that has areas of defined size and shape. After, the exposure or unexposed areas affected by radiation are developed leaving anti-activation mask on the surface. The examples of UV radiation sensitive film are photoresists S1818 as positive and SU-8 as negative.

Another example of the anti-activation mask a rigid or flexible carrier film, for example, a silicon wafer or Polyimide foil that has ink-printed desired size and shape pattern. The carrier with ink-shapes is put into contact with the surface of flexible mask, optionally heated and separated from the flexible mask. The ink pattern defining anti-activation mask size and shape stays on the flexible mask.

In the illustrated embodiment, the flexible mask with anti-activation mask on it is chemically activated by wet or dry surface treatment. The activation renders the surface 6 hydrophilic by increasing the amount of polar groups, such as OH. Dry chemical activation may be done by plasma, ozone or UV light treatment. Examples include oxygen or argon plasma treatment in vacuum or air environment, for instance using low power of 10 to 300 W for short time periods of 10 to 60 seconds. Wet chemical activation may be done by immersing the tool in a specific liquid solution and then rinsing it with water followed by drying by air or nitrogen flow. Examples include 10-30% HF of BHF solutions.

In the illustrated embodiment, after the activation step, the anti-activation mask is removed and only the areas that were exposed to activation and not covered by the anti-activation mask are thus chemically activated.

An anti-activation mask may also or alternatively be applied to the surface of the tool or object to define the periphery (or peripheries depending on whether they are more than one fully enclosed patterned surface areas) of the surface to be patterned.

The surface of the molding die tool intended to be patterned with nano micro structures may also be chemically activated using a similar or different technique to the chemical activation of the flexible mask, the chemical activation of the molding tool die surface configured for enhancing the bonding of the portions of flexible mask that enter into contact with the molding tool die surface.

In a preferred embodiment, both the surfaces of the flexible mask and the tool are chemically activated, however according to variants and depending also on the materials used and the type of chemical activation, it is also within the scope of the invention to activate only the flexible mask or only the tool.

In an advantageous embodiment, the tool surface is chemically functionalized to be able to bind to metal, oxide and other activated surfaces. An example of functionalization comprises surface activation by wet or dry surface treatment. The activation renders the surface hydrophilic by increasing the amount of polar groups, such as OH. Dry chemical activation may done by plasma, ozone or UV light treatment. Examples include oxygen or argon plasma treatment in vacuum or air environment, for instance using low power of 10 W to 300 W for short time periods of 10 to 60 seconds. Wet chemical activation may be done by immersing the tool in specific liquid solution, for instance for 10 to 100 seconds, subsequently rinsing it with water and drying by air or nitrogen flow. Examples of liquid solutions are 20% phosphoric acid solution for aluminum surface activation and 10% HF solution for glass surface activation. Examples of functionalization comprise depositing of a single molecular layer of specific molecules forming a self-assembled monolayer (SAM). Specifically, (3-mercaptopropyl) trimethoxysilane (MPTMS) has two terminal groups: the three methoxy ($-OCH3$) functional end groups and the thiol ($-SH$) functional head group. MPTMS can be applied using liquid, vapor and spin deposition methods.

After the activation step, the flexible mask is placed in contact with the tool surface as illustrated in FIG. 1e. In the activated area, only the top parts of the micro/nano structures of the flexible mask are in physical contact with the tool surface and are covalently bonded to the activated tool surface. For the bonding reaction to take place, in an embodiment the tool and flexible mask is placed in an oven or a heat chamber, for instance at a temperature of 80° C. to 140° C. for 4 to 60 minutes. The temperature range and heating time is adjusted to the size of the tool to compensate for the heating inertia. For example, the bonding of a 3 cm by 3 cm size and 0.3 cm height aluminum alloy tool is finished after the heating for 4 minutes at 80° C. A tool of 15 cm by 15 cm in size and 5 cm in height needs 140° C. treatment for 60 minutes for the bonding to take place. Examples of bonding reactions are: Al with a native $Al_2O_3$ oxide and PDMS surface both have $-OH$ groups after the surface activation in $O_2$ plasma at 30 W for 30 s. Once placed in contact and heated at 80 C for a minimum of 2 to 4 minutes, the covalent bond of Al—O—Si bonds the two surfaces together permanently. Other bonding reactions may however be used, for instance by application of an electrical field between the flexible mask and tool or by inductive heating of the tool.

The flexible mask may then be removed from the tool whereby during the removal process a thin layer of mask material 12, for instance in the range of 5 to 300 nm thickness, corresponding to the elements that entered into contact with the die tool surface remains on the tool and breaks away from the reminder of the flexible mask. The layer of mask remaining on the tool surface as illustrated in FIG. 1F after step S8 thus forms the micro nano structured pattern mask.

The tool surface may then be etched thereby transferring the mask pattern into the tool surface layer. In view of the chemical bonding between the flexible mask layers and the tool surface that produces a very thin layer with very well defined diametrical surface areas and edges of the surface areas the etching process especially at the edges of the mask layers stack onto the tool surface makes very accurate shapes 14 during the etching process. Moreover, the depth of the etching process may be well controlled and deeper etching while maintaining dimensional accuracy can be achieved then in processes with thicker mask layers. Also, in view of the area masking of the flexible mask to clearly define the areas of chemical activation described above, very accurate, and a clean definition of the patterned surface area or plurality of patterned surface areas may be easily achieved.

According to a variant instead of using an anti-activation mask defining the periphery or peripheries of the pattern surface area or areas, the activation process may be performed to define the periphery, especially chemical activation processes that are based on focused means of electrical or electromagnetic fields.

The tool or tools part with the remaining mask areas of flexible mask can optionally be used as a mask to further transfer the micro/nano pattern into the tool surface by wet or dry etching methods or lift off. Due to the covalent bonding the mask is very well attached to the surface and significantly improves mask etch selectivity.

EXAMPLE 1 a tool made of steel with 100 nm thick nano/micro pattern mask pattern is immersed in 40% $FeCl_3$ solution at room temperature and etched for 30 seconds, removed from the solution, rinsed with water and dried in $N_2$ flow. The etching produces 700 nm deep steel nano/micro structures.

EXAMPLE 2 a steel tool having 500 nm thick aluminum coating and 100 nm thick micro/nano pattern masks is immersed into Al-etch (commercial solution) at room temperature for 3 min, removed from the solution, rinsed with water and dried in $N_2$ flow. The etching produces 300 nm deep aluminum nano/micro structures.

In a variant, the production of a master pattern mold may be omitted, whereby in such variants the flexible mask may be produced without the use of a master pattern, for instance directly by lithographic processes, per se well known, or by other micro nano structure forming processes used for master pattern production. Said otherwise, in such variants each flexible mask is produced as if it were the master pattern.

The invention claimed is:

1. Method of patterning a surface of an object or a tool with nano and/or micro structure elements, comprising the steps of:
   producing a flexible mask with said nano or micro structure pattern formed on a surface of said flexible mask;
   chemically activating said surface of the flexible mask and/or a surface to be patterned of the object or tool, placing said patterned surface of the flexible mask in contact with said surface to be patterned of the object or tool, said chemical activation configured to modify chemical properties at the surface of the flexible mask or surface to be patterned of the object or tool to enhance bonding of the chemically activated surface to a complementary material placed in contact with the chemically activated surface;
   promoting a covalent bonding reaction between said patterned surface of the flexible mask in contact with said surface to be patterned, removing the flexible mask from the object or tool whereby a layer of said flexible mask remains bonded to said surface to be patterned;
   wherein an anti-activation mask defining a periphery of the surface area to be patterned, or peripheries of the surface area to be patterned if there are a plurality of separate portions of surface area to be patterned, is deposited on the flexible mask prior to placing the patterned surface of the flexible mask on the surface to be patterned, said anti-activation mask preventing bonding of the flexible mask to the surface of the object or tool in areas where the anti-activation mask is present.

2. The method of claim 1, wherein the anti-activation mask is a flexible polymer-based layer of a defined size and shape applied by coating, adhesion or transfer.

3. The method of claim 1, wherein the anti-activation mask is placed on the patterned surface of the flexible mask and removed from the flexible mask after the chemical activation step.

4. The method of claim 1, wherein the anti-activation mask is placed on the patterned surface of the flexible mask and/or object or tool after chemical activation and remains on the flexible mask and/or object or tool during the step of placing said patterned surface of the flexible mask in contact with said surface to be patterned of the object or tool.

5. The method of claim 1, wherein both the patterned surface of the flexible mask and the surface to be patterned of the object or tool are chemically activated.

6. The method of claim 1, wherein chemical activation of the flexible mask and/or the object or tool surface is dry or wet chemical activation selected from a group consisting of plasma charged activation, electron beam activation, light or laser beam activation, electrical field activation, magnetic field activation, reactive gas activation, and liquid chemical solution activation.

7. The method of claim 6 wherein the dry chemical activation is selected from a group consisting of surface activation by plasma, ozone or UV light treatment.

8. The method of claim 6 wherein the wet chemical activation comprises immersion of the surface to be activated in a liquid solution for chemical activation, subsequently rinsing the surface with water, and drying the surface by gas flow.

9. The method of claim 1, wherein the flexible mask is produced by forming of a hardenable material on a flat master pattern tool.

10. The method of claim 1, wherein the flexible mask is made from a polymeric material.

11. The method of claim 1, further comprising etching said surface to be patterned of the tool or object whereby the bonded layer of flexible mask material resists etching.

12. The method of claim 1, wherein the object or tool is made of metal.

13. The method of claim 1, wherein the object or tool is coated with a material selected from a metal selected from a group consisting of titanium, aluminum, chromium, nickel, gold or platinum, or from a non-metal selected from a group consisting of plastic, glass, amorphous ceramics, crystalline ceramics, diamond, and multilayers of these materials.

14. The method of claim 1 applied to a tool, said tool selected from a group consisting of a molding tool, an imprinting tool, an embossing tool, a cutting tool, a pressing or stamping tool.

15. The method of claim 1, wherein the anti-activation mask is placed on the patterned surface of the object prior to chemical activation and removed from the object after the chemical activation step.

16. Method according to claim 1, wherein the anti-activation mask is placed on the patterned surface of the tool prior to chemical activation and removed from the tool after the chemical activation step.

* * * * *